(12) United States Patent
Liu et al.

(10) Patent No.: US 11,310,928 B2
(45) Date of Patent: Apr. 19, 2022

(54) LED DISPLAY WATERPROOF STRUCTURE

(71) Applicant: UNILUMIN GROUP CO., LTD, Guangdong (CN)

(72) Inventors: Yuanxian Liu, Guangdong (CN); Kuang Yang, Guangdong (CN)

(73) Assignee: UNILUMIN GROUP CO., LTD, Shenzhen (CN)

( * ) Notice: Subject to any disclaimer, the term of this patent is extended or adjusted under 35 U.S.C. 154(b) by 0 days.

(21) Appl. No.: 16/917,849

(22) Filed: Jun. 30, 2020

(65) Prior Publication Data
US 2021/0185839 A1 Jun. 17, 2021

(30) Foreign Application Priority Data

Dec. 12, 2019 (CN) .......................... 201911275638.5

(51) Int. Cl.
| | | |
|---|---|---|
| *H05K 7/02* | (2006.01) | |
| *H05K 7/04* | (2006.01) | |
| *H05K 5/02* | (2006.01) | |
| *H05K 5/00* | (2006.01) | |
| *H05K 5/03* | (2006.01) | |

(52) U.S. Cl.
CPC ......... *H05K 5/0217* (2013.01); *H05K 5/0017* (2013.01); *H05K 5/0213* (2013.01); *H05K 5/0247* (2013.01); *H05K 5/03* (2013.01)

(58) Field of Classification Search
USPC ........................................................ 361/807
See application file for complete search history.

(56) References Cited

U.S. PATENT DOCUMENTS

| | | | |
|---|---|---|---|
| 3,285,784 A * | 11/1966 | Babusci | H01M 50/109 |
| | | | 429/174 |
| 2008/0080133 A1 | 4/2008 | Yang et al. | |
| 2010/0102519 A1* | 4/2010 | Yoshitsune | F16J 15/106 |
| | | | 277/641 |

(Continued)

FOREIGN PATENT DOCUMENTS

| | | |
|---|---|---|
| CN | 202712426 U | 1/2013 |
| CN | 203113889 U | 8/2013 |

(Continued)

OTHER PUBLICATIONS

Search report of counterpart European Patent Application No. 20184063.4 dated Dec. 8, 2020.

(Continued)

*Primary Examiner* — Hung S. Bui

(57) ABSTRACT

The present disclosure provides an LED display waterproof structure including a display bottom case, a first sealing ring and a waterproof cover. A side surface of the display bottom case is provided with a first U-shaped ring groove, a side surface of the first sealing ring towards the waterproof cover is provided with a second U-shaped ring groove, a first surface of the waterproof cover is provided with a ring protrusion matching the second U-shaped ring groove, the waterproof cover is provided on the first U-shaped ring groove through the first sealing ring, the ring protrusion is connected to the second U-shaped ring groove through interference fit, and the second U-shaped ring groove is connected to the first U-shaped ring groove through interference fit.

14 Claims, 5 Drawing Sheets

(56) References Cited

U.S. PATENT DOCUMENTS

2020/0267865 A1* 8/2020 Zhang .................. G09F 9/33

FOREIGN PATENT DOCUMENTS

| CN | 204884445 U | 12/2015 |
| CN | 206603609 U | 11/2017 |
| CN | 207966361 U | 10/2018 |
| CN | 208335643 U | 1/2019 |
| CN | 109764133 A | 5/2019 |
| JP | 2009037843 A | 2/2009 |
| JP | 2010118425 A | 5/2010 |
| JP | 2015062001 A | 4/2015 |

OTHER PUBLICATIONS

1st Office Action of counterpart Chinese Patent Application No. 201911275638.5 dated Oct. 10, 2020.

\* cited by examiner

LED DISPLAY WATERPROOF STRUCTURE

CROSS REFERENCE TO RELATED APPLICATIONS

The present application claims the benefit of Chinese Patent Application No. 201911275638.5 filed on Dec. 12, 2019, the contents of which are incorporated herein by reference in their entirety.

TECHNICAL FIELD

The present disclosure relates to the technical field of LED display, in particular to a LED display waterproof structure.

BACKGROUND

The conventional LED display waterproof structure is mainly used to solve the waterproof problem caused by the signal seat via holes between the display bottom case and the power supply cavity (specifically the bottom plate of the power supply box). The existing method to solve this problem is mainly to provide a waterproof cover and a sealing ring, that is, a sealing ring is added at the connection between the waterproof cover and the display bottom case to seal and waterproof. The conventional sealing ring is usually a flat structure, which needs to be sealed by pressing back and forth. For the outdoor LED display module with small pitch, due to its small dot spacing, it is not possible to achieve front maintenance by inserting a knob with a hex wrench, that is, the display bottom case cannot be provided with screws around the sealing ring, such that the sealing ring cannot be compressed, and the purpose of sealing and waterproofing cannot be achieved.

SUMMARY

The main objective of the present disclosure is to provide an LED display waterproof structure, which aims to solve the waterproof and sealing problems of the outdoor LED display module with small pitch.

In order to achieve the above objective, the present disclosure provides an LED display waterproof structure, the LED display waterproof structure includes a display bottom case, a first sealing ring and a waterproof cover, a side surface of the display bottom case provided with the waterproof cover defines first signal seat via holes and a first U-shaped ring groove surrounding the first signal seat via holes, a side surface of the first sealing ring towards the waterproof cover is provided with a second U-shaped ring groove, a side surface of the waterproof cover towards the display bottom case is provided with a ring protrusion matching the second U-shaped ring groove, the waterproof cover is provided on the first U-shaped ring groove through the first sealing ring, thereby the ring protrusion is connected to an inner side wall of the second U-shaped ring groove through interference fit, and an outer side wall of the second U-shaped ring groove is connected to the first U-shaped ring groove through interference fit.

In an embodiment, both the inner side wall and the outer side wall of the second U-shaped ring groove are provided with protrusions, and each of the protrusions is provided around the inner side wall of the second U-shaped ring groove or around the outer side wall of the second U-shaped ring groove.

In an embodiment, a bottom wall of the second U-shaped ring groove is provided with vent holes configured to conduct an airflow between the first U-shaped ring groove and the second U-shaped ring groove.

In an embodiment, first ribs are provided in a groove of the second U-shaped ring groove, and two ends of each first rib are respectively connected to two inner side walls of the second U-shaped ring groove; grooves are provided on a top of the ring protrusion, and the grooves are configured to correspond one-to-one with the first ribs.

In an embodiment, second signal seat via holes are provided on the waterproof cover, the second signal seat via holes are configured to correspond one-to-one with the first signal seat via holes; the LED display waterproof structure further includes a power supply box bottom plate, and third signal seat via holes are provided on the power supply box bottom plate, the third signal seat via holes are configured to correspond one-to-one with the second signal seat via holes; the power supply box bottom plate is tightly connected to a surface of the waterproof cover towards the power supply box bottom plate through screw structures.

In an embodiment, the LED display waterproof structure further includes a second sealing ring, and the second sealing ring is between the power supply box bottom plate and the waterproof cover.

In an embodiment, a side surface of the waterproof cover towards the power supply box bottom plate is provided with a third U-shaped ring groove, the third U-shaped ring groove is configured to correspond with the ring protrusion, cylindrical blind holes are provided in the third U-shaped ring groove, the second sealing ring is a flat ring structure, second cylinders are provided on a surface of the second sealing ring towards the waterproof cover, and the second cylinders are configured to correspond one-to-one with the cylindrical blind holes.

In an embodiment, second ribs are provided in the groove of the third U-shaped ring groove, and two ends of each second rib are respectively connected to two inner side walls of the third U-shaped ring groove.

In an embodiment, a side surface of the second sealing ring towards the waterproof cover is provided with two first flat annular protrusions, and a first groove is between the two first flat annular protrusions, the second cylinders are provided in the first groove; a side surface of the waterproof cover towards the power supply box bottom plate is further provided with two ring grooves, and the two ring grooves are configured to correspond one-to-one with the two first flat annular protrusions.

In an embodiment, a height of a side wall of the ring groove adjacent to the third U-shaped ring groove is lower than a height of a side wall of the ring groove away from the third U-shaped ring groove.

The present disclosure provides an LED display waterproof structure, including a display bottom case, a first sealing ring and a waterproof cover. The waterproof cover is provided on the first U-shaped ring groove of the display bottom case through the first sealing ring, such that the ring protrusion is connected to an inner side wall of the second U-shaped ring groove through interference fit, and an outer side wall of the second U-shaped ring groove is connected to the first U-shaped ring groove through interference fit. As such, the LED display waterproof structure can realize the front and back compression of the first sealing ring without a screw structure, ensuring a tight connection between the waterproof cover and the display bottom case. Meanwhile, the ring protrusion is connected to the inner side wall of the second U-shaped ring groove through interference fit, and the outer side wall of the second U-shaped ring groove is connected to the first U-shaped ring groove through interference fit, multiple waterproofing can be formed by one sealing ring to further improve the overall waterproofing performance. It can be seen that this technical solution can effectively solve the waterproof and sealing problems of the outdoor LED display with small pitch.

BRIEF DESCRIPTION OF THE DRAWINGS

In order to more clearly illustrate the embodiments of the present disclosure or the technical solutions in the related art, the drawings used in the embodiments or the related art will be briefly described below. Obviously, the drawings in the following description are only some embodiments of the present disclosure. It will be apparent to those skilled in the art that other figures can be obtained from the structures illustrated in the drawings without the inventive effort.

DETAILED DESCRIPTION OF THE EMBODIMENTS

The specific implementation of the present disclosure will be further described below with reference to the drawings. It should be noted that the description of these embodiments is used to help understand the present disclosure, but does not constitute a limitation on the present disclosure. In addition, the technical features involved in the embodiments of the present disclosure described below can be combined with each other as long as there is no conflict with each other.

Figure 1:
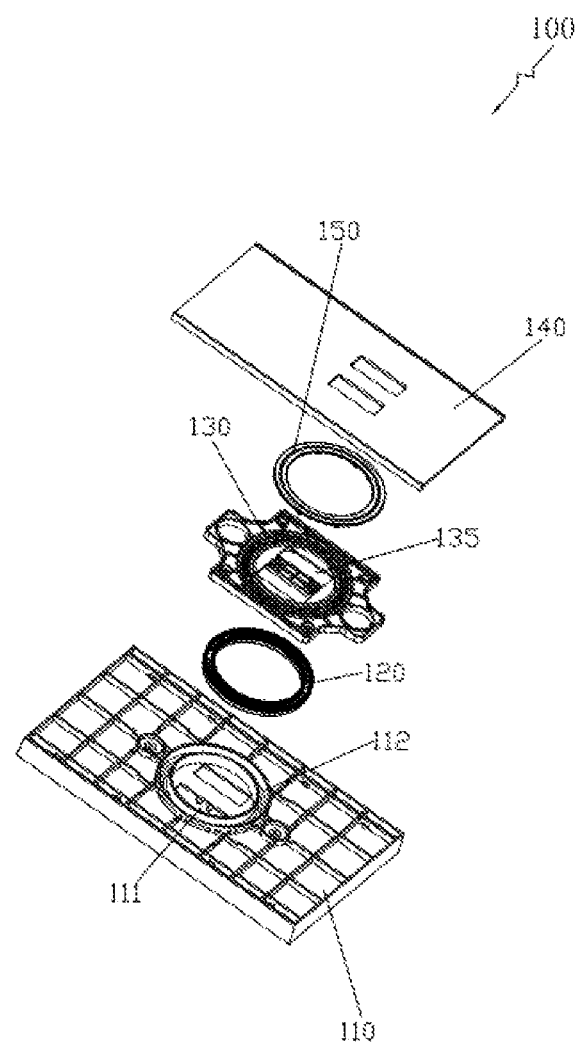
FIG. 1 is an exploded schematic view of an LED display waterproof structure according to an embodiment of the present disclosure.
Figure 2:
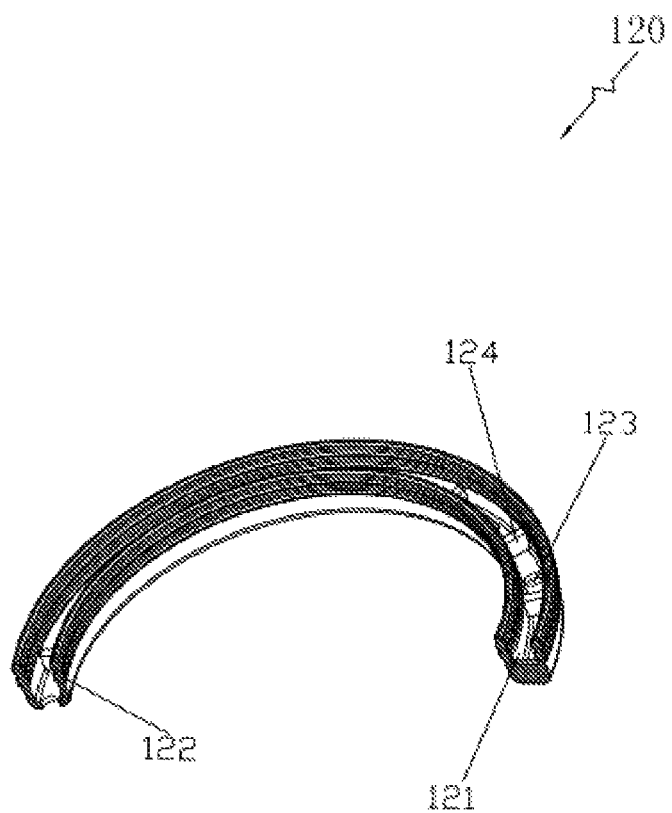
FIG. 2 is a partial structural view of a first sealing ring of the LED display waterproof structure shown in FIG. 1.
Figure 3:
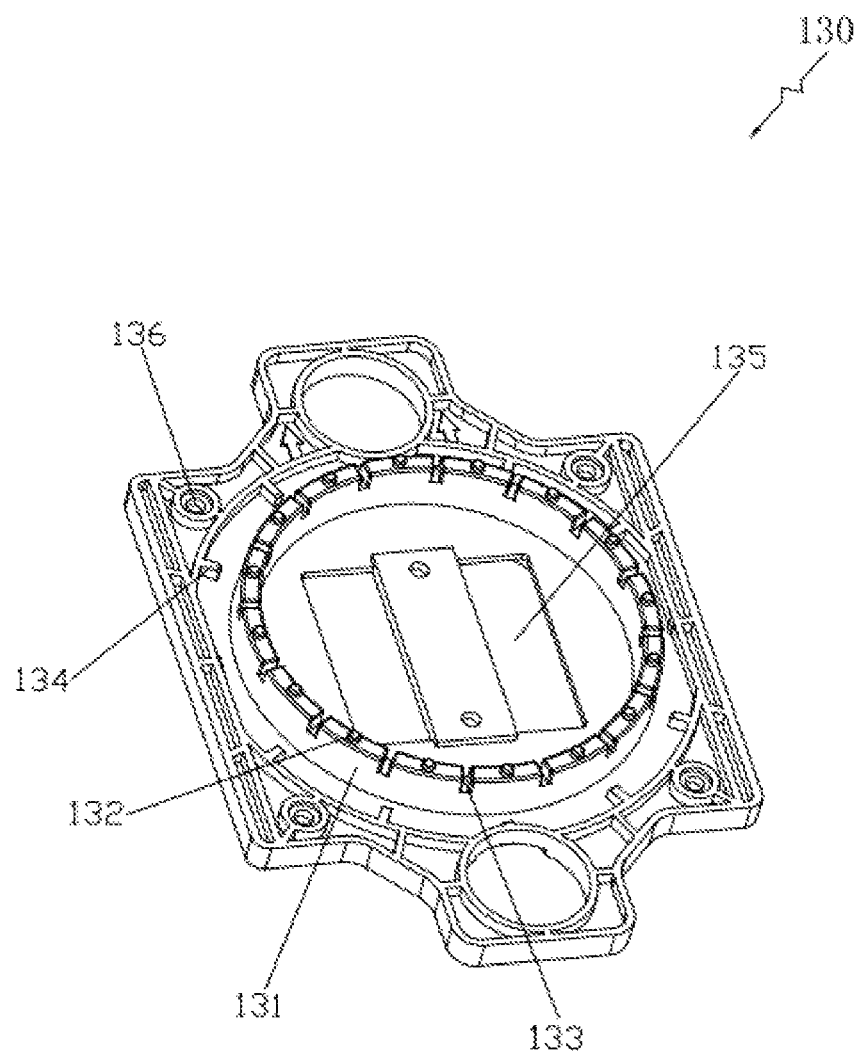
FIG. 3 is a schematic structural view of a waterproof cover of the LED display waterproof structure shown in FIG. 1 from another perspective.

As shown in FIG. 1 to FIG. 3, an embodiment of the present disclosure provides an LED display waterproof structure 100. The LED display waterproof structure 100 includes a display bottom case 110, a first sealing ring 120 and a waterproof cover 130. The display bottom case 110 is provided on a side surface of the waterproof cover 130 with first signal seat via holes 111 and a first U-shaped ring groove 112 surrounding the first signal seat via holes 111, a side surface of the first sealing ring 120 towards the waterproof cover 130 is provided with a second U-shaped ring groove 121, a side surface of the waterproof cover 130 towards the display bottom case 110 is provided with a ring protrusion 131 matching the second U-shaped ring groove 121, the waterproof cover 130 is provided on the first U-shaped ring groove 112 through the first sealing ring 120, thereby the ring protrusion 131 is connected to an inner side wall of the second U-shaped ring groove 121 through interference fit, and an outer side wall of the second U-shaped ring groove 121 is connected to the first U-shaped ring groove 112 through interference fit.

In the present embodiment, as shown in FIG. 2, both the inner side wall and the outer side wall of the second U-shaped ring groove 121 are provided with protrusions 122, and each of the protrusions 122 is provided around the inner side wall of the second U-shaped ring groove 121 or around the outer side wall of the second U-shaped ring groove 121. Specially, in this embodiment, two loops of protrusions 122 are provided on the two inner side walls of the second U-shaped ring groove 121. When the ring protrusion 131 is connected to the inner side wall of the second U-shaped ring groove 121 through interference fit, the ring protrusion 131 can be pressed by the two loops of protrusions 122, thereby forming a double waterproof protection between the two and before and after the two to further ensure the sealing performance between the two.

As shown in FIG. 2 and FIG. 3, a bottom wall of the second U-shaped ring groove 121 is provided with vent holes 123. First cylinders 132 are provided on the top of the ring protrusion 131. The first cylinders 132 are configured to correspond one-to-one with the vent holes 123. First ribs 124 are provided in a groove of the second U-shaped ring groove 121, and two ends of each first rib 124 are respectively connected to two inner side walls of the second U-shaped ring groove 121; grooves 133 are provided on a top of the ring protrusion 131, and the grooves 133 are configured to correspond one-to-one with the first ribs 124. As such, when the ring protrusion 131 is connected to the inner side wall of the second U-shaped ring groove 121 through interference fit, the first cylinders 132 are inserted into the corresponding vent holes 123, while the first ribs 124 are inserted into the corresponding grooves 133. The arrangement of the first ribs 124 serves to strengthen the connection in the groove of the second U-shaped ring groove 121. The first cylinders 132 are inserted into the corresponding vent holes 123, which can play the role of quickly expelling the air in the groove of the second U-shaped ring groove 121 from the vent holes 123, such that the second U-shaped ring groove 121 communicates with the first U-shaped ring groove 112. The display module on the bottom case 110 generates heat during operation, so that the air in the first U-shaped ring groove 112 increases in pressure due to the temperature increase. Since the bottom wall of the second U-shaped ring groove 121 is provided with the vent holes 123, the air pressure inside and outside the second U-shaped ring groove 121 is balanced. Furthermore, the outer side wall of the first sealing ring 120 and the inner side wall of the first U-shaped ring groove 112 are closely adhered to each other, thereby ensuring a good waterproof effect between the first sealing ring 120 and the bottom case 110. Besides, ribs 134 are further provided on the surface of the waterproof cover 130 towards the display bottom case 110. The ribs 134 are provided on the outer side of the ring protrusion 131. Each rib 134 extends in the direction of the center of the ring protrusion 131, and each rib 134 is provided with a gap between the outer side wall of the ring protrusion 131 and the gap is greater than 0.05 mm. When the ring protrusion 131 is connected to the inner side wall of the second U-shaped ring groove 121 through interference fit, the ring protrusion 131 may press the outer side wall of the second U-shaped ring groove 121, to ensure a tight connection between the two.

As shown in FIG. 1, second signal seat via holes 135 are provided on the waterproof cover 130, the second signal seat via holes 135 are configured to correspond one-to-one with the first signal seat via holes 111. The LED display waterproof structure further 100 includes a power supply box bottom plate 140, and third signal seat via holes 141 are provided on the power supply box bottom plate 140, the third signal seat via holes 141 are configured to correspond one-to-one with the second signal seat via holes 135; the power supply box bottom plate 140 is tightly connected to a surface of the waterproof cover 130 towards the power supply box bottom plate 140 through screw structures (not shown). Specially, threaded blind holes (not shown) are provided on the surface of the power supply box bottom plate 140 towards the waterproof cover 130, and the thread blind holes are configured to correspond one-to-one with the screw via holes 136 to achieve a threaded connection between the two.

Figure 4:
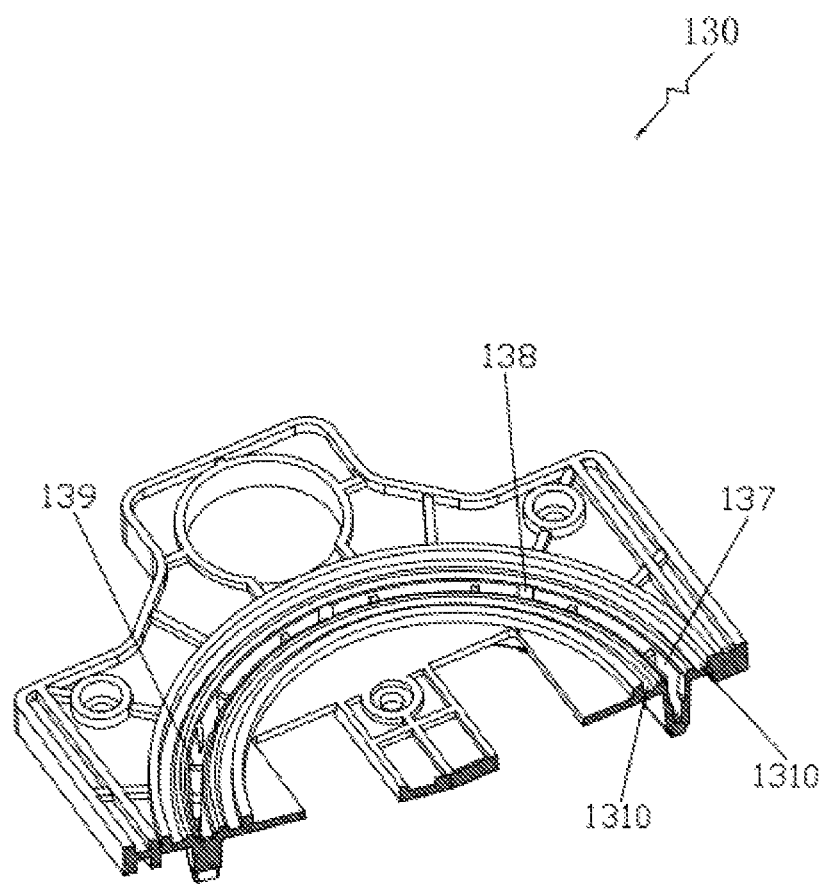
FIG. 4 is a partial structural view of the waterproof cover of the LED display waterproof structure shown in FIG. 1.
Figure 5:
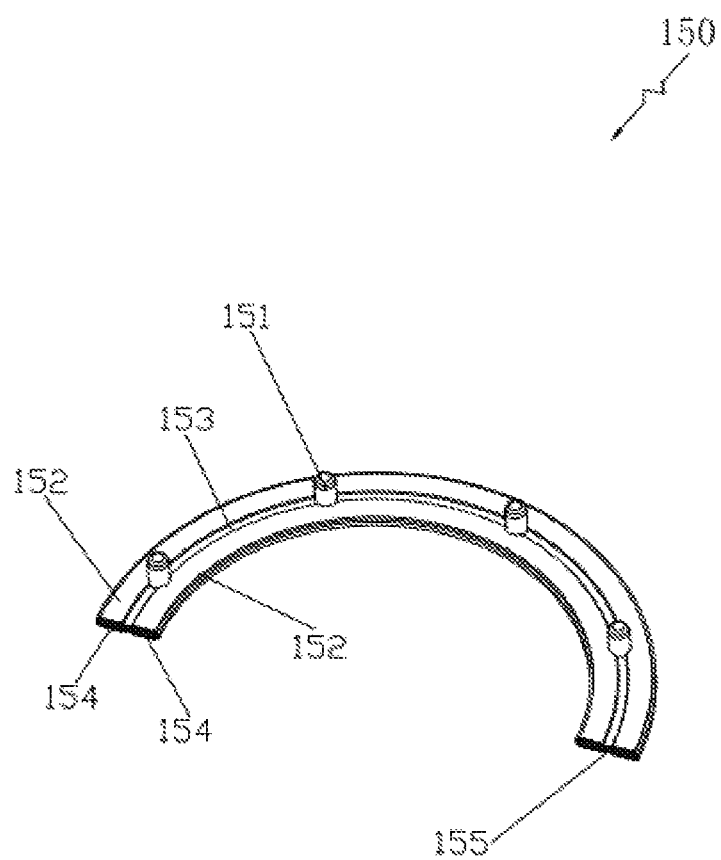
FIG. 5 is a partial structural view of a second sealing ring of the LED display waterproof structure shown in FIG. 1.

In order to ensure a tight connection between the power supply box bottom plate 140 and the waterproof cover 130, as shown in FIG. 1, the LED display waterproof structure 100 further includes a second sealing ring 150, and the second sealing ring 150 is between the power supply box bottom plate 140 and the waterproof cover 130. Specially, as shown in FIG. 4 and FIG. 5, a side surface of the waterproof cover 130 towards the power supply box bottom plate 140 is provided with a third U-shaped ring groove 137, the third U-shaped ring groove 137 is configured to correspond with the ring protrusion 131, cylindrical blind holes 138 are provided in a groove of the third U-shaped ring groove 137, the second sealing ring 150 is a flat ring structure, second cylinders 151 are provided on a surface of the second sealing ring 150 towards the waterproof cover 130, and the second cylinders 151 are configured to correspond one-to-one with the cylindrical blind holes 138. Second ribs 139 are provided in the groove of the third U-shaped ring groove 137, and two ends of each second rib 139 are respectively connected to two inner side walls of the third U-shaped ring groove 137. A side surface of the second sealing ring 150 towards the waterproof cover 130 is provided with two first flat annular protrusions 152, and a first groove body 153 is between the two first flat annular protrusions 150, the second cylinders 151 are provided in a groove of the first groove body 153; a side surface of the waterproof cover 130 towards the power supply box bottom plate 140 is further provided with two ring grooves 1310, and the two ring grooves 1310 are configured to correspond one-to-one with the two first flat annular protrusions 152. Specially, a height of a side wall of the ring groove 1310 adjacent to the third U-shaped ring groove 137 is lower than a height of a side wall of the ring groove 1310 away from the third U-shaped ring groove 137. As such, when the second sealing ring 150 is provided on the surface of the waterproof cover 130 towards the power supply box bottom plate 140, the second cylinders 151 are inserted into the corresponding cylindrical blind holes 138 one by one, and the two first flat annular protrusions 152 are also placed in the corresponding circular grooves 1310 one by one. The arrangement of the second ribs 139 serves to strengthen the connection in the groove of the third U-shaped ring groove 137, and the two first flat annular protrusions 152 can also play a double waterproof protection role between the second sealing ring 150 and the waterproof cover 130.

Besides, as shown in FIG. 5, a side surface of the second sealing ring 150 towards the power supply box bottom plate 140 is provided with two second flat annular protrusions 154, and a second groove 155 is between the two second flat annular protrusions 154. In this way, when the waterproof cover 130 installed with the second sealing ring 150 is tightly connected to the power supply box bottom plate 140 through several screw structures (not shown), the two second flat annular protrusions 154 can play a double waterproof protection role between the second sealing ring 150 and the power supply box bottom plate 140.

An LED display waterproof structure in the embodiments of the present disclosure includes a display bottom case, a first sealing ring and a waterproof cover. The waterproof cover is provided on the first U-shaped ring groove of the display bottom case through the first sealing ring, such that the ring protrusion is connected to an inner side wall of the second U-shaped ring groove through interference fit, and an outer side wall of the second U-shaped ring groove is connected to the first U-shaped ring groove through interference fit. As such, the LED display waterproof structure can realize the front and back compression of the first sealing ring without a screw structure, ensuring a tight connection between the waterproof cover and the display bottom case. Meanwhile, the ring protrusion is connected to the inner side wall of the second U-shaped ring groove through interference fit, and the outer side wall of the second U-shaped ring groove is connected to the first U-shaped ring groove through interference fit, multiple waterproofing can be formed by one sealing ring to further improve the overall waterproofing performance. It can be seen that this technical solution can effectively solve the waterproof and sealing problems of the outdoor LED display with small pitch.

The embodiments of the present disclosure have been described in detail above in conjunction with the drawings, but the present disclosure is not limited to the described embodiments. For those skilled in the art, without departing from the principle and spirit of the present disclosure, various changes, modifications, replacements, and variations to these embodiments still fall within the protection scope of the present disclosure.

What is claimed is:

1. An LED display waterproof structure comprising a display bottom case, a first sealing ring and a waterproof cover, wherein:
   a side surface of the display bottom case is provided with a first U-shaped ring groove;
   a side surface of the first sealing ring towards the waterproof cover is provided with a second U-shaped ring groove;
   a first surface of the waterproof cover is provided with a ring protrusion matching the second U-shaped ring groove;
   the waterproof cover is provided on the first U-shaped ring groove through the first sealing ring;
   the ring protrusion is connected to the second U-shaped ring groove through interference fit;
   the second U-shaped ring groove is connected to the first U-shaped ring groove through interference fit;
   a surface of the display bottom case is provided with a first signal seat via hole; and
   the first U-shaped ring groove is configured to surround the first signal seat via hole.

2. The LED display waterproof structure of claim 1, wherein:
   both an inner side wall and an outer side wall of the second U-shaped ring groove are provided with protrusions; and
   each of the protrusions is configured to surround the inner side wall of the second U-shaped ring groove or the outer side wall of the second U-shaped ring groove.

3. The LED display waterproof structure of claim 1, wherein a bottom wall of the second U-shaped ring groove is provided with vent holes.

4. The LED display waterproof structure of claim 1, wherein:
   a groove of the second U-shaped ring groove is provided with first ribs, two ends of each of the first ribs are respectively connected to two inner side walls of the second U-shaped ring groove; and a top of the ring protrusion is provided with grooves configured to correspond one-to-one with the first ribs.

5. The LED display waterproof structure of claim 1, wherein the waterproof cover is provided with second signal seat via holes configured to correspond one-to-one with the first signal seat via hole.

6. The LED display waterproof structure of claim 5, further comprising a power supply box bottom plate, wherein:
   the power supply box bottom plate is provided with a third signal seat via hole configured to correspond one-to-one with the second signal seat via hole; and
   the power supply box bottom plate is connected to a second surface of the waterproof cover opposite to the first surface.

7. The LED display waterproof structure of claim 6, further comprising a second sealing ring between the power supply box bottom plate and the waterproof cover.

8. The LED display waterproof structure of claim 7, wherein the ring protrusion of the waterproof cover is configured to form a third U-shaped ring groove on the second surface of the waterproof cover.

9. The LED display waterproof structure of claim 8, wherein:
   a groove of the third U-shaped ring groove is provided with a cylindrical blind hole; and
   a first surface of the second sealing ring is provided with a second convex pillar configured to be inserted into the cylindrical blind hole.

10. The LED display waterproof structure of claim 8, wherein:
    second ribs are provided in the groove of the third U-shaped ring groove; and
    two ends of each of the second ribs are respectively connected to two inner side walls of the third U-shaped ring groove.

11. The LED display waterproof structure of claim 7, wherein:
    the first surface of the second sealing ring is provided with a first flat annular protrusion; and
    the second surface of the waterproof cover is provided with a circular groove configured to be inserted into the first flat annular protrusion.

12. The LED display waterproof structure of claim 11, wherein:
    the second sealing ring is provided with two concentric first flat annular protrusions; and
    a first groove body is between the two first flat annular protrusions.

13. The LED display waterproof structure of claim 11, wherein:
    a second surface of the second sealing ring opposite to the first surface is provided with two concentric second flat annular protrusions; and
    a second groove body is between the two second flat annular protrusions.

14. The LED display waterproof structure of claim 1, wherein:
    the first U-shaped ring groove is a circular ring groove; or
    the second U-shaped ring groove is a circular ring groove.

* * * * *